United States Patent [19]

Klyce et al.

[11] 4,090,133
[45] May 16, 1978

[54] DIGITAL TIME INTERVAL SENSOR USING A FREE RUNNING COUNTER AND A CYCLE COUNTER WITH ONLY THE LATTER BEING RESET AT EACH EVENT

[75] Inventors: Battle Hargrove Klyce, Middletown; Frank Peter Sansone, Freehold; Roger Mark Ziegler, Tinton Falls, all of N.J.

[73] Assignee: Bell Telephone Laboratories, Incorporated, Murray Hill, N.J.

[21] Appl. No.: 757,373

[22] Filed: Jan. 6, 1977

[51] Int. Cl.² .................. G04F 9/00; G01R 23/02; G01S 9/04
[52] U.S. Cl. .................. 324/186; 324/181; 235/92 T; 235/92 TF; 235/92 FQ; 324/78 D
[58] Field of Search .................. 324/186, 187, 78 D, 324/78 R; 235/92 T, 92 TF, 92 FQ

[56] References Cited

U.S. PATENT DOCUMENTS

| | | | |
|---|---|---|---|
| 3,537,001 | 10/1970 | Friend | 324/78 D |
| 3,760,269 | 9/1973 | Beeman et al. | 324/78 D |
| 3,876,867 | 4/1975 | Schull et al. | 235/92 T |
| 3,889,189 | 6/1975 | Lode | 324/186 |

*Primary Examiner*—Robert J. Corcoran
*Attorney, Agent, or Firm*—Roy C. Lipton

[57] ABSTRACT

Intervals between zero crossings of tone signals on two incoming lines are measured by a clock driven, free running binary counter common to the two lines and by an overflow counter individual to each line. The overflow counter is reset by the reception of the zero crossing of the tone signal and is then advanced by each overflow and recycle of the common counter. The common count number, produced when the zero crossing at the start of the interval is received, is processed with the common count number and the overflow number, produced when the zero crossing at the end of the interval is received, to calculate the duration of the interval and thereby determine the frequency of the tone.

5 Claims, 13 Drawing Figures

FIG. 12
OVERFLOW COUNT = 0

FIG. 13
OVERFLOW COUNT = 1

DIGITAL TIME INTERVAL SENSOR USING A FREE RUNNING COUNTER AND A CYCLE COUNTER WITH ONLY THE LATTER BEING RESET AT EACH EVENT

FIELD OF THE INVENTION

This invention relates to detection and decoding of tone signals and, more particularly, to tone detection using digital techniques.

DESCRIPTION OF THE PRIOR ART

Decimal digits are commonly transmitted over voice frequency lines through the use of a four-by-four code which embodies a low frequency group of four tones and a high frequency group of four tones. The concurrent generation of one tone from each group thereby designates a particular digit. A digital multifrequency tone detector for decoding decimal digits encoded into the four-by-four code is disclosed in U.S. Pat. No. 3,537,001 issued to J. J. Friend on Oct. 27, 1970. In accordance with the Friend patent, tone detection is accomplished by driving a counter with a clock having a known clock pulse rate, resetting the clock pulse counter upon detection of a "0" crossing of the tone and reading the count upon detection of the next subsequent "0" crossing. The read count thus defines the interval between "0" crossings and therefore indicates the frequency of the tone signal. Logic circuitry connected to the counter and arranged in accordance with an algorithm which defines recognition bandwidth limitations for each valid tone signal provides an output indicating the frequency of the received tone if the count falls within the corresponding band count for the tone. The Friend patent arrangement, however, requires separate count circuits for measuring the "0" crossing intervals of each tone being received. Thus, for example, if two voice frequency lines or sources are being monitored and two tones for each line are being received, four counters, two for each line, are required to count the tone "0" crossing intervals.

Accordingly, it is an object of this invention to measure intervals using a common counter.

It is known in the art to use a continuously free running common counter to measure intervals between pairs of events. The common count is read when each event of the pair occurs and the difference between the two count readings is determined to calculate the interval time. Since the counter is continuously running and not reset for each event, it may be utilized for measuring concurrent events. However, if during a prolonged (and perhaps nonvalid) interval, the counter overflows and recycles one or more times, confusion may arise in determining the cycle in which a reading is made, rendering it difficult to properly calculate the difference in the readings. To overcome this problem, the common counter is arranged to be sufficiently large in size to count over a long period without overflowing and recycling, which period is customarily many times greater than the longest interval that will ever be measured.

It is a further object of this invention to minimize the size of the common counter.

SUMMARY OF THE INVENTION

In accordance with the objects of this invention, an overflow counter, set to an initial count by the "0" crossing at the beginning of the interval, counts each overflow (and recycle) of the common counter. The cycle count is then available when the "0" crossing at the end of the interval is received to define the cycle of the common counter. The common counter may thus advantageously be minimized in size to have a cycle period no longer than the longest interval to be measured. Moreover, the overflow counter need not count beyond one overflow since longer intervals are necessarily invalid.

In a specific embodiment of this invention, a plurality of sources or lines are monitored by a common free running counter and by overflow counters individual to each source. When a "0" crossing is detected in the tone on any one of the lines, the common count is read, the count of the overflow counter individual to the line is also read and the overflow counter is reset to its initial count. The common count of the "0" crossing at the beginning of the interval is processed with the common count and the overflow count of the "0" crossing at the end of the interval to measure the interval and thus identify the frequency of the tone signal.

The foregoing and other objects and features of this invention will be more fully understood from the following description of an illustrative embodiment thereof taken in conjunction with the accompanying drawings.

DETAILED DESCRIPTION

Figure 1:
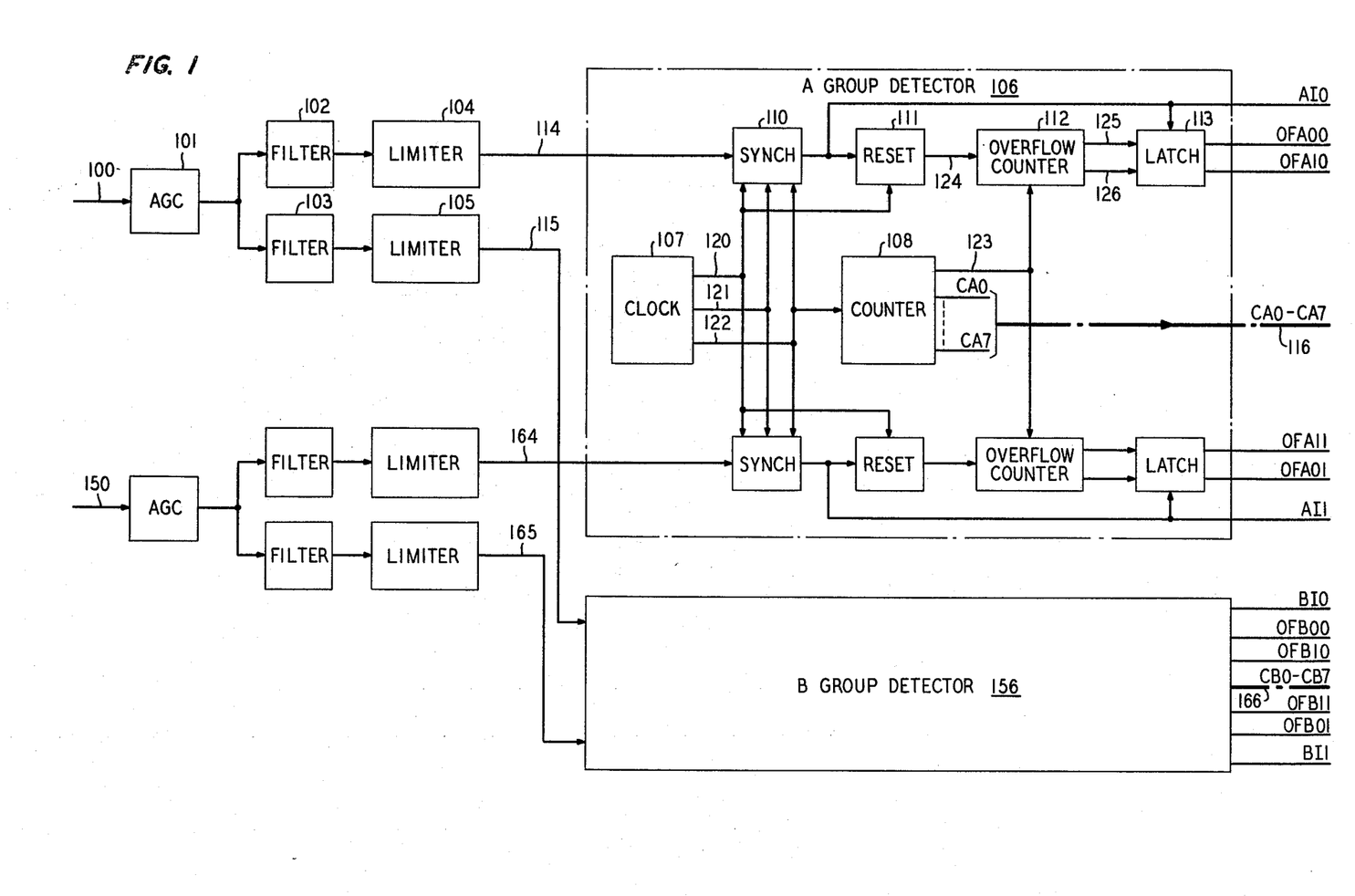
FIG. 1 and FIG. 2, when arranged as shown in FIG. 3, disclose in block form a two line multifrequency tone detector in accordance with this invention.
Figures 2, 3:
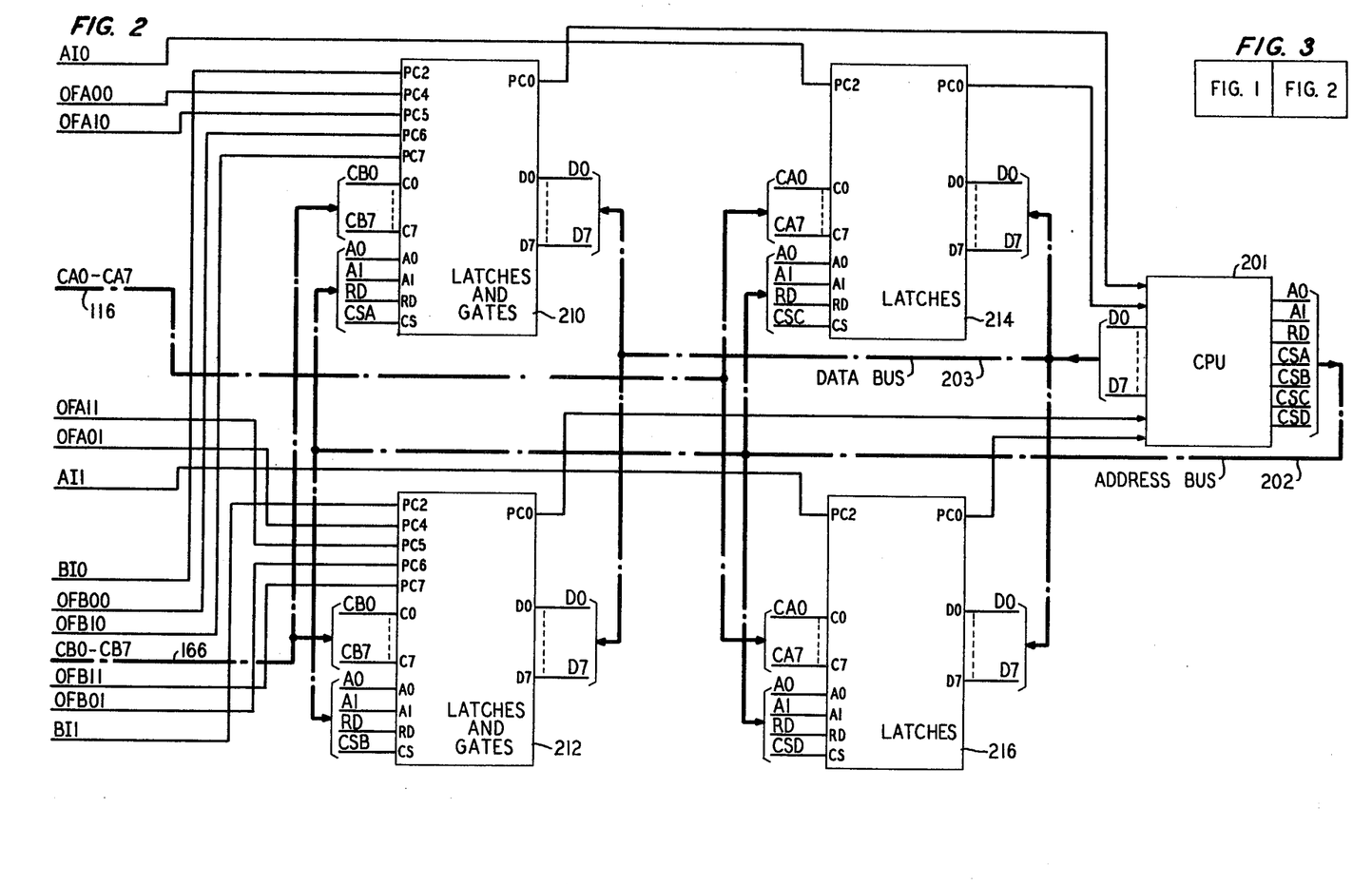

The multifrequency tone detector shown in FIGS. 1 and 2 is arranged to monitor incoming frequency coded decimal digits on two telephone lines, namely, telephone line 100 and telephone line 150. The incoming multifrequency tone signals on telephone line 100 are passed through automatic gain control circuit 101 to filters 102 and 103. The filters advantageously comprise bandpass filters which separate out tones in the high frequency group and tones in the low frequency group. Filter 102 thereby passes, for example, the tone in the high frequency group to limiter 104, and filter 103 passes the tone in the low frequency group to limiter 105. Limiters 104 and 105 square the tone signals applied thereto (and may also divide down the squared wave to provide an averaging of a plurality of pulse intervals to thereby render the detector less immune to noise). The high frequency tone square wave from limiter 104 and the low frequency tone square wave from limiter 105 are then passed by leads 114 and 115, respectively, to "A" group detector 106 and "B" group detector 156.

In a corresponding manner incoming multifrequency tones on telephone line 150 are amplified and filtered to separate the high and low frequency groups, which tones are similarly limited and the high and low frequency limited tone signals are passed via leads 164 and 165 to "A" group detector 106 and "B" group detector 156, respectively.

"A" group detector 106 generally functions to detect the "0" crossings of the limited tone signal and provide common clock count and count overflow numbers. The indication that a "0" crossing has been detected in the tone signal on lead 114 is provided, by "A" group detector 106, to lead AI0. At the same time "A" group detector 106 passes a continuous running count to leads CA0-CA7 in cable 116. Finally, "A" group detector 106 stores an overflow count when the "0" crossing on lead 114 is detected and applies this count to leads OFA00 and OFA10. Additionally, "A" group detector 106 applies the indication of the detection of the "0" crossing of the tone signal on lead 164 to output lead AI1 and passes overflow counts individual to this latter tone signal to leads OFA11 and OFA01.

"B" group detector 156 is arranged in substantially the same way as "A" group detector 106 with the exception that a slight modification of the clock frequency is advantageously arranged to better accommodate the low frequency group of tones to be detected. Accordingly, "B" group detector 156 provides a continuous running count to leads CB0-CB7 in cable 166. With respect to the tone signal on lead 115, "B" group detector 156 passes the "0" crossing indication to lead BI0 and the overflow count to leads OFB00 and OFB01. Similarly, with respect to the tone frequency on lead 165, "B" group detector 156 applies the indication of the "0" crossing to load BI1 and the overflow count to leads OFB11 and OFB01.

The outputs of "A" group detector 106 and "B" group detector 156 are passed to latches and gates 210, 212, 214 and 216 in FIG. 2. For example, "0" crossing indications on lead AI0 are passed in input terminal PC2 of latches 214. Continuing with respect to the tone signal on lead 114, the overflow counts on leads OFA00 and OFA01 are passed to input terminals PC4 and PC5 of latches and gates 210 to be applied to certain gates therein. The running counts on leads CA0 to CA7 in cable 116 are passed to input terminals C0-C7 of latches 214 and latches 216.

As described in further detail hereinafter, when a "0" crossing indication is provided to lead AI0, latches 214 write the running count number applied by leads CA0 to CA7 to input terminals C0-C7 into the latches therein. At the same time, latches 214 pass an interrupt request through output terminal PC0 to processor 201. Processor 201 thereupon initiates a conventional interrupt routine which includes addressing the latches in latches 214 and addresses certain gates in latches and gates 210. More specifically, processor 201 initially applies appropriate address signals to address bus 202 to energize appropriate ones of input terminals A0, A1, RD and CS of latches 214 to read out the number stored therein through terminals D0-D7 to data bus 203. The running count number generated by "A" group detector 106 concurrently with the detection of the "0" crossing of the tone signal on lead 114 is thereby read into processor 201 by way of data bus 203. In a subsequent step of the interrupt routine, processor 201 applies appropriate address signals to address bus 202 to energize appropriate ones of input terminals A0, A1, RD and CS of latches and gates 210. This enables the gates therein to pass the overflow count applied to input terminals PC4 and PC5 to certain ones of output terminals D0-D7 to thereby pass the overflow count to processor 201 by way of data bus 203.

The processor at this time has now received the running count and the overflow count individual to a "0" crossing of the tone signal on lead 114. This process is repeated for a subsequent "0" crossing on lead 114. The process is arranged to provide conventional arithmetical operations with respect to the pair of running counts for the two "0" crossings, and the overflow count for the second or subsequent one of the "0" crossings, which operations may specifically include (1) calculating the difference in the running counts in the presence of an overflow count of zero or (2) summing the running count for the first or prior one of the "0" crossings with the saturation count of the counter and then subtracting the running count of the second or subsequent "0" crossing in the presence of an overflow count of "1". Processor 201 may also advantageously determine that the signal is invalid in the presence of an overflow count of "2". The result of these simple calculations produce a number which defines the interval between the two "0" crossings of the tone wave. Processor 201 is thereupon advantageously arranged to decode the calculated number and determine if the number falls within established clock count bands which correspond to recognition bandwidth limits of the tones to be detected and to provide an output indication if the calculated number falls within one of the count bands established by the decoder logic. Suitable decoder logic for providing this output indication is taught in the above-identified J. J. Friend patent.

Counts corresponding to other running counts and overflow counts are similarly distributed throughout the various latches and gates. Thus, the "0" crossing indication on lead AI1 is applied to input terminal PC2 of latches 216 and the running count on cable 116 is correspondingly applied to input terminals C0-C7 in latches 216. At the same time, the overflow counts on leads OFA11 and OFA01 are passed to input terminals PC4 and PC5 in latches and gates 212. Thus, when a "0" crossing is received in lead 164, the interrupt routine is requested via the lead extending from output terminal PC0 of latches 216, and processor 201 thereupon successively addresses latches 216 and latches and gates 212 to obtain the running count and the overflow count in substantially the same manner as these counts were obtained with respect to the tone signal on lead 114. Accordingly, processor 201 provides the various indication of the incoming tone signals received on telephone lines 100 and 150.

"A" group detector 106 contains a synchronizing circuit, a reset circuit, an overflow counter and a latch circuit for each of input leads 114 and 164. In addition, "A" group detector 106 includes a common clock circuit and a common free running counter circuit. As priorly noted, "B" group detector 156 is arranged in substantially the same manner as "A" group detector 106 with the exception that the common clock circuit has a lower clock frequency to accommodate the tone frequencies in the low frequency group. Since the common counter is free running, it is apparent that one common clock circuit, such as clock 107, and one common counter circuit, such as counter 108, may also be utilized for the counting operations in "B" group detector 156.

Figure 11:
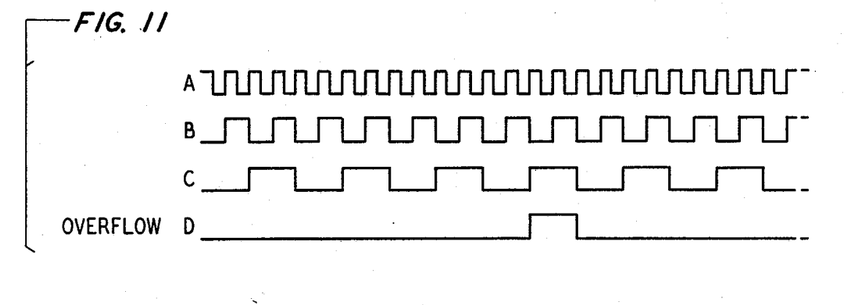
FIG. 11 through FIG. 13 depict timing waves produced by inputs to and equipment of the multifrequency tone detector.

As seen in FIG. 1, the common clock circuit which is identified as clock 107 has three output leads which are identified as leads 120-122. Clock 107 applies a basic clock pulse to lead 120, which pulse is shown as timing wave A in FIG. 11. Clock 107 also applies a clock pulse having one-half the basic clock frequency to lead 121, which is shown as waveform B in FIG. 11. Clock 107, in addition, applies a clock pulse having one-fourth the basic clock frequency to lead 122, which clock pulse is shown as waveform C in FIG. 11. The clock pulse on lead 122 is applied to free running binary counter 108 and counter 108, in response thereto, passes its binary number counts to lead CA0–CA7, which leads are identified as cable 116. In addition, when counter 108 reaches its maximum count and recycles back to its initial count, it passes an overflow pulse to lead 123, which overflow pulse is shown as waveform D in FIG. 11. In this embodiment, counter 108 has eight binary stages, counting through a cycle of $2^8$ or 256 counts and, with respect to the clock pulse rate on load 122, the cycle interval being at least as long as the longest valid "0" crossing interval to be measured.

The output of clock 107 is also applied to synchronizing circuit 110 and concurrently applied to the corresponding synchronizing circuit associated with lead 164. Synchronizing circuit 110 monitors the tone signal on lead 114 and, in response to a "0" crossing which is a positive transition, generates a pulse aligned with the clock pulse on lead 120. As representative examples, a tone signal "0" crossing transition on lead 114 occurring prior to the counter overflow pulse D is shown as timing wave E in FIG. 12 and a "0" crossing transistion occurring subsequent to the counter overflow pulse is shown as timing wave E in FIG. 13. The consequent output pulse of sync 110 is shown as timing wave H in FIGS. 12 and 13. This output pulse is applied to lead AI0 to be passed to input terminal PC2 in latches 214 and indicates the reception of a "0" crossing, as previously described. The output pulse of synchronizing circuit 110 is also passed to reset circuit 111 and latch 113.

Figure 12:
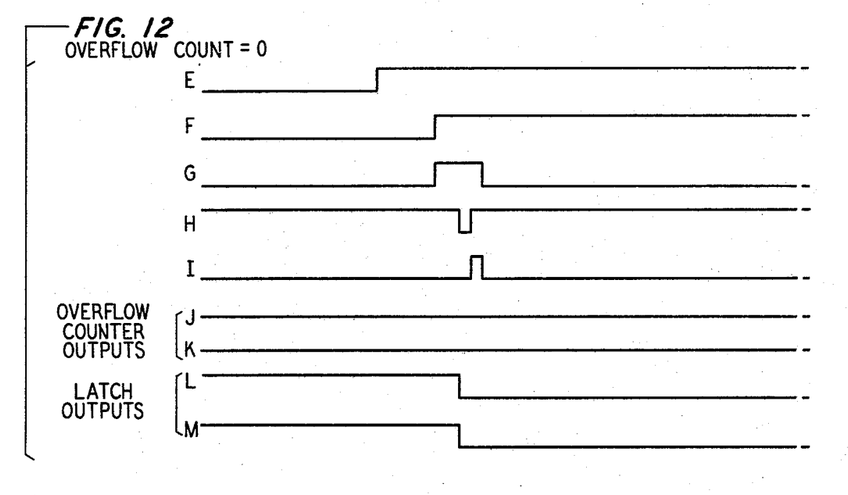
Figure 13:
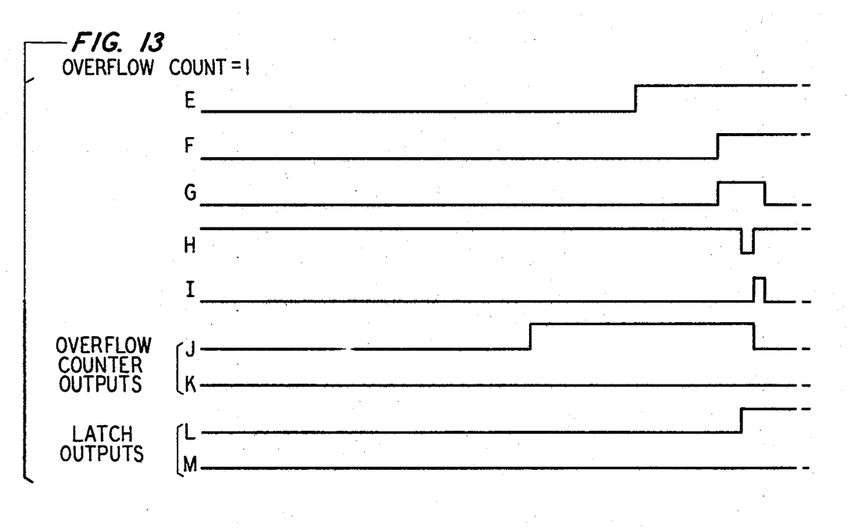

Reset circuit 111 is driven by output pulse H of synchronizing circuit 110 and by the clock pulse A on lead 120 to generate a reset pulse shown in waveform I in FIGS. 12 and 13. This reset pulse is passed to lead 124 to reset overflow counter 112 to its initial count. Overflow counter 112 in turn is driven by the overflow pulse D on lead 123 to be thereby advanced by this overflow pulse and be periodically reset when a positive transistion of the tone signal "0" crossing is received and reset circuit 111 applied, via lead 124, the reset pulse I. As described in detail hereinafter, overflow counter 112 has only two stages arranged to start initially in stage "0" and advance to state "2", if not reset, at stage "2", the overflow pulses do not further advance overflow counter 112, the advancing to this state indicating that the pulse interval is not valid.

As previously noted, the output pulse H of sync 110 is additionally passed to latch 113. This pulse is utilized as a reading pulse to read the over-flow counter output number on leads 125 and 126 into latch 113. Thus, when a "0" crossing is received, the number count in overflow counter 112 is read into and stored by latch 113 in response to pulse wave H and overflow counter 112 is thereafter reset by pulse wave I from reset ciruit 111. Accordingly, since the overflow counter counts cycles of free running counter 108, the relationship between the clock pulse on lead 122 and the number of stages in counter 108 may be such that the interval required to provide a full count in counter 108 need only be as long as the longest interval, between the "0" crossing, of a valid tone signal. It is also noted that the reset circuit overflow counter circuit and the latch circuit associated with lead 164 operated in the same manner as synchronizing circuit 110, reset circuit 111, overflow counter 112 and latch circuit 113.

Figure 4:
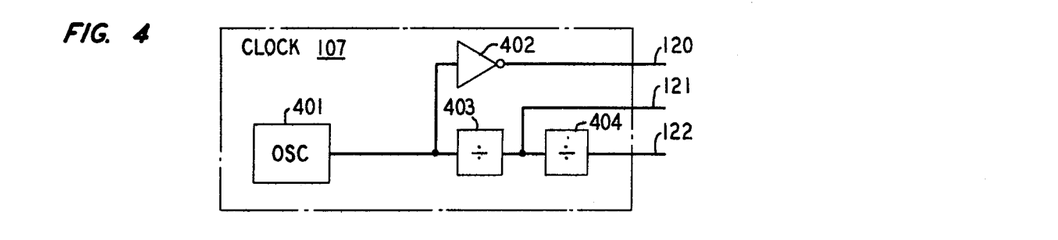
FIG. 4 through FIG. 10 disclose, in schematic form, the circuit details of components of the multifrequency tone detector.

The details of a clock circuit, such as clock circuit 107, is shown in FIG. 4. Clock circuit 107 includes square wave oscillator generator 401, inverter 402 and dividers 403 and 404. Dividers 403 and 404 are divide-by-2 circuits. The output of inverter 402 is applied to lead 120 and therefore comprises the basic clock frequency shown as timing wave A, the output of divider 403 is passd to lead 121 and comprises one-half the basic clock frequency, which was previously identified as timing wave B, and finally the output of divider 404 is applied to lead 122 and constitutes the previously identified timing wave C.

Figure 5:
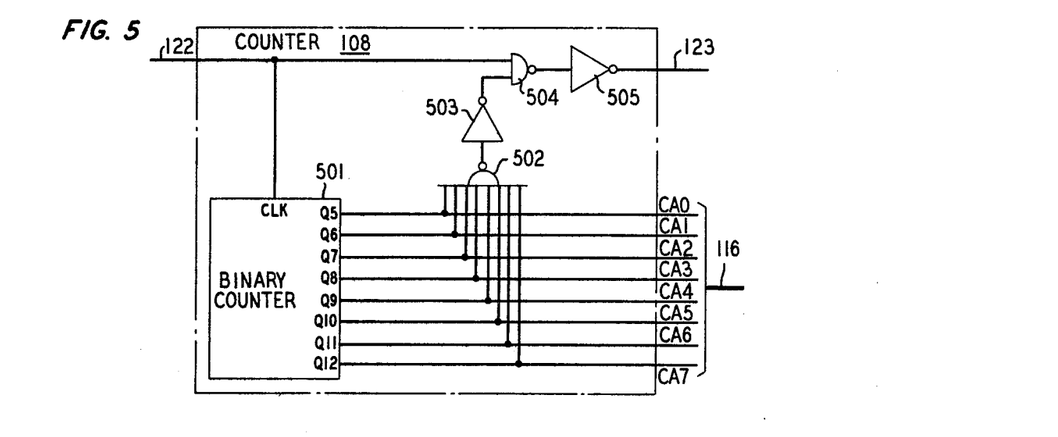

The details of counter 108 are shown in FIG. 5. The clock pulse wave C on lead 122 is passed to the clock input of binary counter 501. The outputs of the several stages of binary counter 501 are applied by way of output terminals Q5–Q12 to leads CA0–CA7 which, as previously described, make up cable 116. These leads are also applied to NAND gate 502 enabling the NAND gate when binary counter 501 achieves its maximum count. NAND gate 502 enables, in turn, NAND gate 504 by way of inverter 503. The clock pulse on lead 122 is thereupon passed through NAND gate 504 and inverter 505 to lead 123, which clock pulses constitutes the overflow pulse shown as timing wave D.

Figure 6:
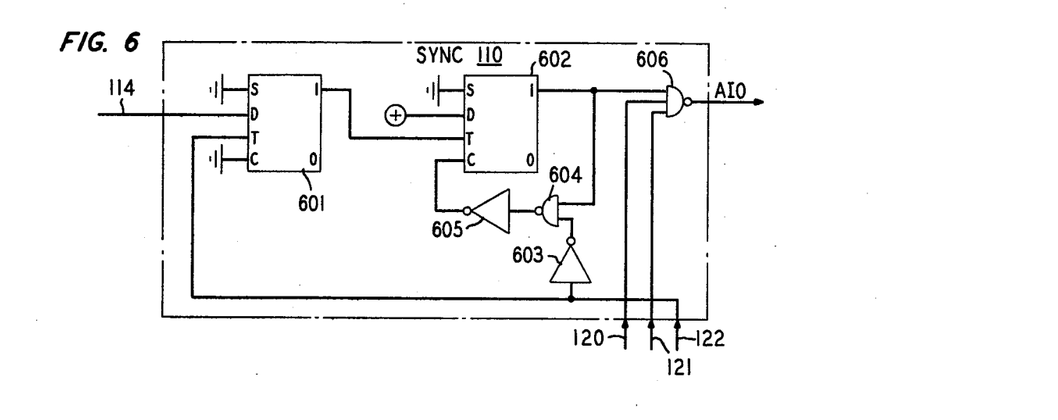

The details of synchronizing circuit 110 are shown in FIG. 6. The tone signal on lead 114 is applied to the D input of flip-flop 601 in synchronizing circuit 110. Accordingly, when the tone signal goes high, flip-flop 601 is toggled to the set condition by the clock pulse on lead 122. The consequent positive transition at output terminal 1 of flip-flop 601 is shown as timing wave F in FIGS. 12 and 13. Flip-flop 601 will be subsequently toggled back to the clear condition when the timing wave on lead 114 restores to its negative condition. This latter transition, however, is otherwise not recognized by synchronizing circuit 110 and no further function is performed in response to this negative transition.

The positive output transition of flip-flop 601 toggles flip-flop 602 to the set condition. Output terminal 1 of flip-flop 602 thereupon goes high enabling NAND gate 604 and partially enabling NAND gate 606. The clock pulse on lead 122, inverted by inverter 603, is passed through NAND gate 604 and inverted by inverter 605 to clear flip-flop 602. Output terminal 1 of flip-flop 602 thereupon restores, providing a single pulse output shown as timing wave G in FIGS. 12 and 13.

NAND gate 606 is partially enabled by the output pulse of flip-flop 602, as previously noted. The clock pulse on lead 121 (timing wave B) fully enables NAND gate 606. This premits the clock pulse on lead 120 to be passed through the NAND gate to lead AI0, which pulse as previously noted, constitutes timing wave H in FIGS. 12 and 13, which pulse wave indicates the reception of the "0" crossing of the tone wave.

Figure 7:
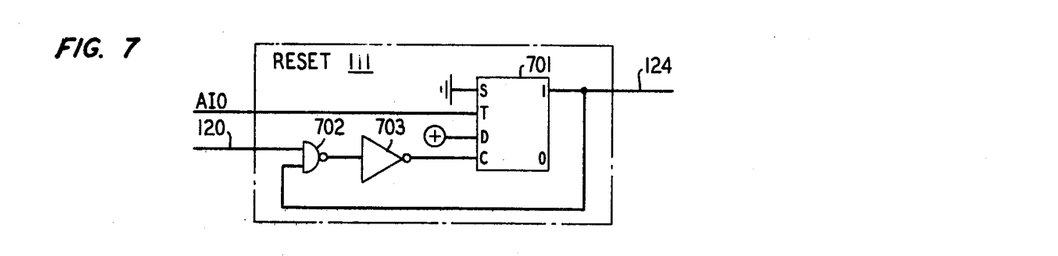

The details of reset circuit 111 are shown in FIG. 7. The pulse wave H on lead AI0, which indicates the reception of the "0" crossing of the tone wave, is applied to the toggle input of flip-flop 701 in reset circuit 111. Accordingly, when the "0" crossing is received, flip-flop 701 is toggled to the set condition. With flip-flop 701 set, a positive condition is applied to output terminal 1 to enabled NAND gate 702. The clock pulse on lead 120 is thereupon passed through NAND gate 702 and inverted by inverter 703 to clear flip-flop 701. Output terminal 1 of flip-flop 701 is also connected to output lead 124 and the setting and subsequent clearing of the flip-flop applies to lead 124 a single reset pulse output shown as timing wave I.

Figure 8:
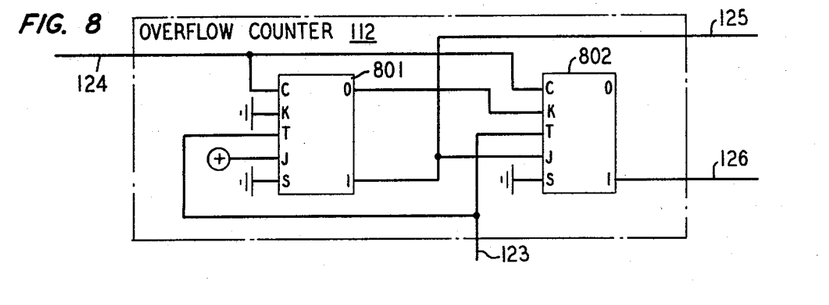

The details of overflow counter 112 are shown in FIG. 8. In the initial count condition flip-flops 801 and 802 are in the cleared state. This provides low output conditions to leads 125 and 126, which low conditions define a "0" count. When common counter 108 overflows, it provides the overflow pulse D to lead 123, as previously described. This pulse is applied to the toggle inputs of flip-flops 801 and 802. Flip-flop 801 is thereby initially toggled to the set condition providing a high output condition to lead 125. Flip-flop 802 remains set as flip-flop 801 previously applied a low condition to input terminal K and a high condition to input terminal J. Flip-flop 801 set and flip-flop 802 clear apply a high condition to lead 125 and a low condition of lead 126. This corresponds to the "1" count of overflow counter 112.

Assume now that a "0" crossing of the tone wave is received. Reset pulse I appears on lead 124 from reset circuit 111. This pulse is passed to the clear inputs of flip-flops 801 and 802. Flip-flop 801 is restored to the clear condition and, since flip-flop 802 is already clear, the "0" count is reapplied to output leads 125 and 126.

Return now to the condition where overflow counter 112 has advanced to the "1" count. With flip-flop 801 in the set condition the high output condition at output terminal 1 is passed to the J input of flip-flop 802 and the low condition at output terminal 0 is applied to the K input of flip-flop 802. The next overflow pulse on lead 123 thereupon toggles flip-flop 802 to the set condition. With both flip-flops in the set condition, high conditions are applied to both leads 125 and 126 and this constitutes a "2" count. Since, as previously described, counter 108 is sufficiently large to count over a full interval between "0" crossings of the lowest frequency tone, it is apparent that an overflow count of two in overflow counter 112 designates a frequency less than any valid tone. Thus, the count of two on leads 125 and 126 defines the reception of a non-valid signal. Overflow counter 112 does not respond to further overflow pulses on lead 123 since the flip-flops 801 and 802 are set and the overflow pulse tends to set them at this time, thereby not changing the count state. Subsequent reception of the "0" crossing of the tone wave develops a new reset lead 124 to clear both flip-flops 801 and 802.

Figure 9:
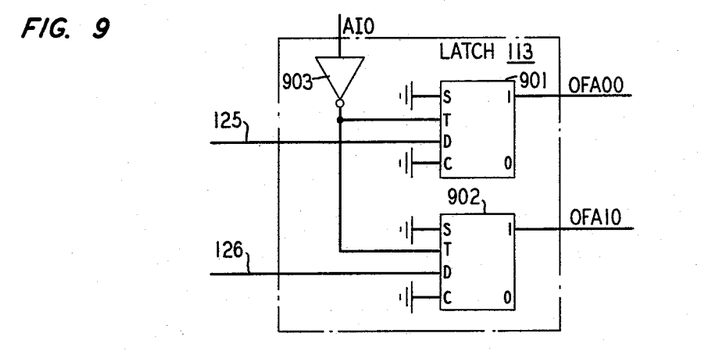

The overflow count number on leads 125 and 126 are passed to latches 113 shown in detail in FIG. 9. Leads 125 and 126 are connected to the D input terminals of flip-flops 901 and 902. The toggle inputs of the flip-flops are connected to lead AI0 by way of inverter 103. Accordingly, when a "0" crossing of the tone wave is received, the pulse H on lead AI0, inverted toggles flip-flops 901 and 902 to store the input number on leads 125 and 126. More specifically, flip-flops 901 and 902 are cleared if low conditions or "0" bits are on leads 125 and 126, respectively, and the flip-flops are set if high conditions are on the respective ones of input leads 125 and 126. It is to be noted that the overflow count is read into latch 113 by pulse H before overflow counter 112 is reset by the reset pulse I on lead 124, since, as previously described, the reset pulse on lead 124 occurs after the "0" crossing pulse on lead AI0. Latch 113 therefore stores the overflow count number, applying this number by way of output terminals "1" of flip-flops 901 and 902 to leads OFA00 and OFA10, respectively.

Figure 10:
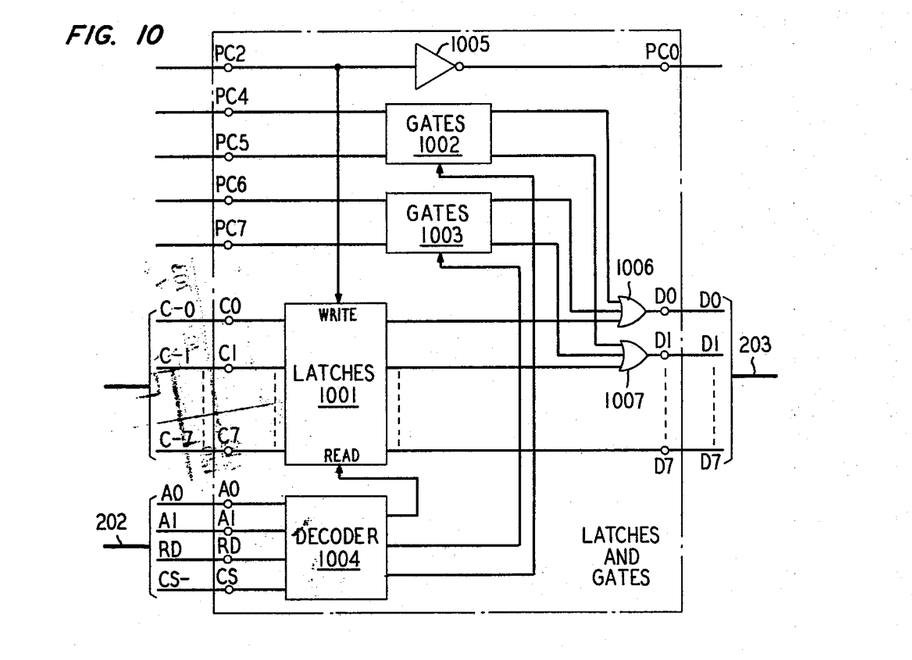

A typical latches and gates circuit is shown in FIG. 10. Input terminals C0–C7, which, for example, may be connected to leads CA0–CA7 extend to latches 1001. When the "0" crossing pulse on lead AI0, for example, is received and passed to terminal PC2, the input write lead of latches 1001 is energized and the common counter number is thereby stored in the latches. At the same time, inverter 1005 passes the "0" crossing pulse to output terminal PC0 where it is then passed on to processor 201, as previously described. When the processor addresses the latches and gates by applying the appropriate address signals to the address leads in address bus 202, these signals are read by decoder 1004. Decoder 1004 thereupon energizes the appropriate output lead, which lead extends to the read input terminal of latches 1001. Latches 1001 thereupon reads out the counter number passing the counter number via output leads D0–D7 (via OR gates 1006 and 1007) to data bus 203 and thus sending the counter number of processor 201.

Overflow counts, such as the overflow count on leads OFA00 and OFA10, and the overflow count on leads OFB00 and OFB10 may be applied to gates 1002 and 1003 in the latches and gates. When processor 201 desires to read one or the other of the overflow counts, it applies the appropriate address signals to address bus 202. Decoder 1004 thereupon develops an energizing pulse and applies it to an appropriate one of the two leads extending to gates 1002 and 1003. The appropriate one of gates 1002 and 1003 are thereby enabled, passing the overflow count through OR gates 1006 and 1007 to output leads D0 and D1 of data bus 203. The overflow count number is thereby passed to processor 201.

Although a specific embodiment of this invention has been shown and described, it will be understood that various modifications may be made without departing from the spirit of this invention.

We claim:

1. An arrangement for measuring the interval between a first and second event comprising:
   a free running counter for generating numbers during each cycle thereof;
   means for counting cycles of the counter;
   means responsive to the first event for resetting the cycle counting means to an initial count and reading a first number including the current number generated by the counter without resetting the counter;
   means responsive to the second event for reading a composite number comprising the current cycle count and the current number generated by the counter; and
   means for determining the difference between said first and said composition numbers.

2. An arrangement for measuring in accordance with claim 1 wherein the cycle counting means includes means responsive to a predetermined cycle count for terminating cycle counting.

3. A detector of tone signals comprising:
   a free running counter for generating numbers during each cycle thereof;
   means for counting cycles of the counter;
   means responsive to zero crossings of the tone signal for reading the number generated by the counter without resetting the counter;
   further means responsive to zero crossings of the tone signal for reading the current cycle count and for resetting the cycle counting means to an initial count; and means responsive to the generated numbers and the cycle counts for identifying the frequency of the tone signal.

4. A detector, in accordance with claim 3, further including means for precluding the cycle counting means from advancing upon achieving a predetermined cycle count.

5. An arrangement for monitoring a plurality of sources of tone signals including a common free running counter for continuously generating numbers during each cycle thereof and means responsive to the respective zero crossings of each tone signal for reading the respective number generated by the common counter without resetting the counter,
characterized by
means individual to each source for counting cycles of the common counter;
means responsive to the zero crossings of each tone signal for reading the current count of the cycle counting means individual to the source thereof and for resetting the cycle counting means to an initial count; and
means responsive to the generated numbers and the cycle counts, during adjacent zero crossings of each tone signal, for determining the frequency of the tone signal.

* * * * *